US012581602B2

(12) United States Patent
Kim

(10) Patent No.: US 12,581,602 B2
(45) Date of Patent: Mar. 17, 2026

(54) ENHANCED PRYING STRUCTURE FOR AN ELECTRONIC DEVICE

(71) Applicant: Sandisk Technologies, Inc., Milpitas, CA (US)

(72) Inventor: MyungJin Kim, Santa Clara, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 140 days.

(21) Appl. No.: 18/516,012

(22) Filed: Nov. 21, 2023

(65) Prior Publication Data

US 2025/0168993 A1 May 22, 2025

(51) Int. Cl.
| | |
|---|---|
| *H05K 5/00* | (2025.01) |
| *H05K 9/00* | (2006.01) |
| *G11B 33/02* | (2006.01) |

(52) U.S. Cl.
CPC ........... *H05K 5/0052* (2013.01); *H05K 5/006* (2013.01); *H05K 9/0037* (2013.01); *G11B 33/022* (2013.01)

(58) Field of Classification Search
None
See application file for complete search history.

(56) References Cited

U.S. PATENT DOCUMENTS

| | | | |
|---|---|---|---|
| 5,372,515 A | 12/1994 | Miller et al. | |
| 5,379,184 A | 1/1995 | Barraza et al. | |
| 6,212,447 B1 * | 4/2001 | Kohge | B62D 5/0457 |
| | | | 701/1 |

| | | | |
|---|---|---|---|
| 8,559,155 B2 | 10/2013 | Gillard et al. | |
| 10,700,483 B1 | 6/2020 | Piper et al. | |
| 2002/0131226 A1 | 9/2002 | Oldfield et al. | |
| 2003/0011979 A1 | 1/2003 | Tanzer et al. | |
| 2006/0093303 A1 | 5/2006 | Reagan et al. | |
| 2014/0036402 A1 | 2/2014 | Tsai | |
| 2014/0076897 A1 | 3/2014 | Manahan et al. | |
| 2015/0201520 A1 | 7/2015 | Jau et al. | |

(Continued)

FOREIGN PATENT DOCUMENTS

| | | | |
|---|---|---|---|
| CA | 2750166 A1 | 8/2010 | |
| CN | 115968182 A | 4/2023 | |
| JP | 4075971 B2 * | 4/2008 | ............. B62D 5/065 |

OTHER PUBLICATIONS

Micro Electronics, Inc., Benefits of installing a Hard Drive Enclosure as Primary or Secondary Drive, 2023, 1 page, downloaded at https://www.microcenter.com/tech_center/article/4990/benefits-of-installing-a-hard-drive-enclosure-as-primary-or-secondary-drive.

(Continued)

*Primary Examiner* — Allen L Parker
*Assistant Examiner* — Christopher L Augustin
(74) *Attorney, Agent, or Firm* — DENTONS Durham Jones Pinegar

(57) ABSTRACT

In the context of an electronic device such as a solid-state drive, implementation of a prying opening in a sidewall of an enclosure base, and positioned adjacent to a corresponding stepped structure along a sidewall of an enclosure cover, enables an effective prying mechanism enabling the disassembling of the electronic device. A stepped structure surface extending beyond the prying opening of the base forms a narrow pathway with the sidewall of the base, thus providing a structural mechanism to inhibit the transfer of ESD to the sensitive components of the device.

20 Claims, 9 Drawing Sheets

(56) References Cited

U.S. PATENT DOCUMENTS

| | | | |
|---|---|---|---|
| 2019/0236044 A1 | 8/2019 | Rust et al. | |
| 2022/0115881 A1* | 4/2022 | Yamanaka | H02J 7/0042 |
| 2024/0260204 A1* | 8/2024 | Uchida | H05K 5/03 |

OTHER PUBLICATIONS

IBM, Removing a disk drive or solid-state drive from an ESLL or ESLS storage enclosure, last updated Apr. 14, 2021, downloaded at https://www.ibm.com/docs/en/power9?topic=drives-removing-disk-drive-solid-state-drive.

International Search Report and Written Opinion from International Application No. PCT/US2024/040034, mailed Nov. 5, 2024, 9 pages.

* cited by examiner

304

304p

304s

304p

700

COUPLE A PRINTED CIRCUIT BOARD (PCB) TO AN ENCLOSURE BASE COMPRISING A PRYING OPENING IN AT LEAST ONE SIDEWALL OF THE BASE
702

COUPLE TO THE BASE A COVER COVERING THE PCB, THE COVER COMPRISING A STEPPED STRUCTURE, EXTENDING ALONG A COVER SIDEWALL DISPOSED WITHIN THE BASE, POSITIONED AT LEAST IN PART ADJACENT WITH THE PRYING OPENING OF THE BASE
704

ENHANCED PRYING STRUCTURE FOR AN ELECTRONIC DEVICE

FIELD OF EMBODIMENTS

Embodiments of the invention may relate generally to electronic devices such as solid-state storage devices, and particularly to an enhanced prying structure for opening such devices.

BACKGROUND

Enterprise solid-state storage devices, or solid-state drives (SSDs), are commonly used in client, hyperscale and enterprise compute environments. Since SSDs are made from flash memory (e.g., NAND (NOT AND) flash memory), they can be built in many different form factors and are typically associated with industry standard form factors and corresponding specifications and protocols. For example, a family of specifications referred to as Enterprise and Datacenter Standard Form Factor (EDSFF) were developed to address the concerns of data center storage. For example, EDSFF E3 is a family of form factors designed to update and replace the traditional U.2 2.5-inch form factor in servers and storage systems, and were largely designed for future servers and storage systems. The primary usage of E3 is for SSDs and/or storage class memory, but E3 is big enough to accommodate a broader range of device types (for non-limiting examples, accelerators or network interface cards).

Any approaches that may be described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Embodiments are illustrated by way of example, and not by way of limitation, in the figures of the accompanying drawings and in which like reference numerals refer to similar elements and in which.

DETAILED DESCRIPTION

Figure 1:
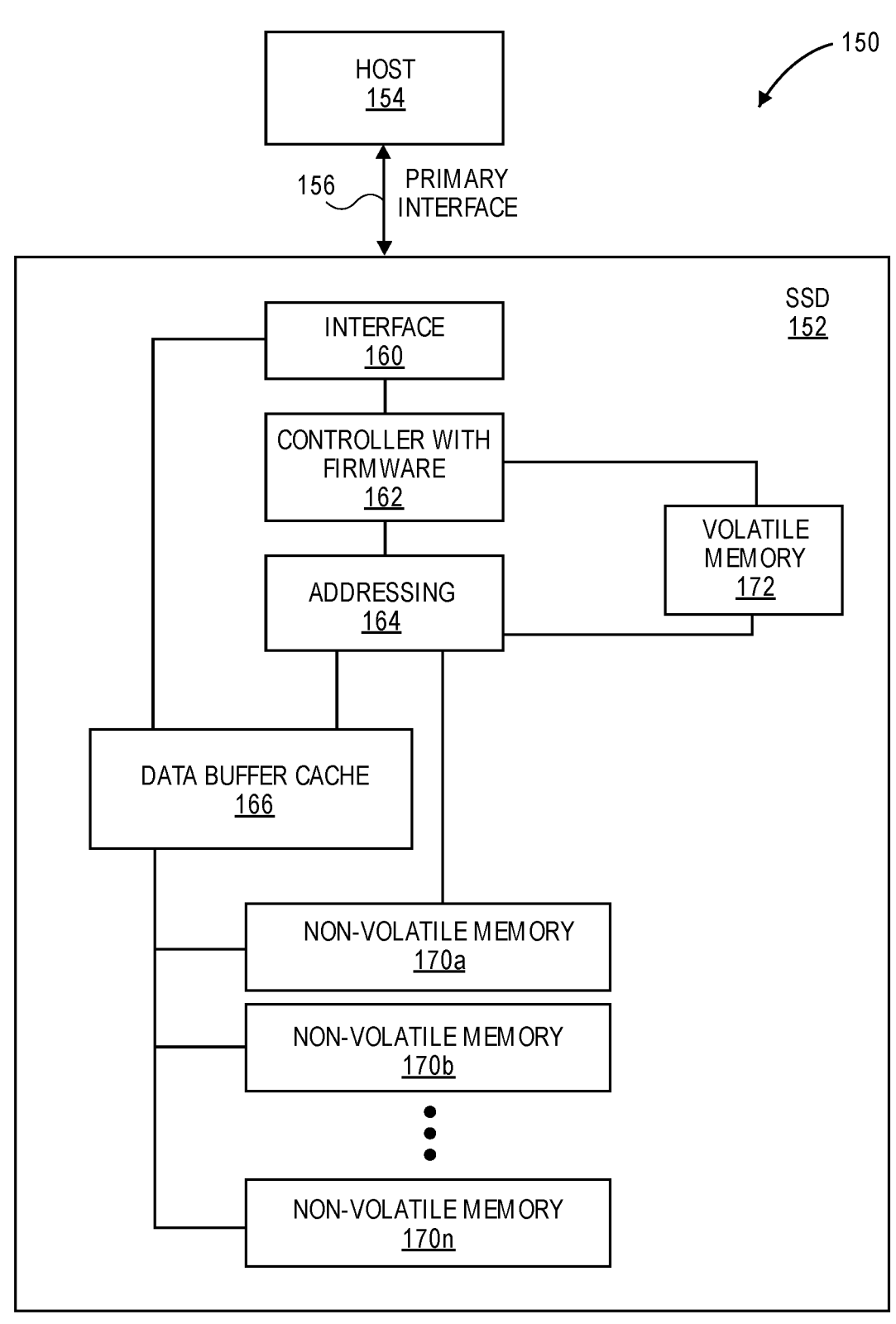
FIG. 1 is a block diagram illustrating a solid-state drive (SSD), according to an embodiment.

Generally, approaches to an enhanced prying structure for electronic devices are described. In the following description, for the purposes of explanation, numerous specific details are set forth to provide a thorough understanding of the embodiments of the invention described herein. It will be apparent, however, that the embodiments of the invention described herein may be practiced without these specific details. In other instances, well-known structures and devices may be shown in block diagram form to avoid unnecessarily obscuring the embodiments of the invention described herein.

Introduction

Terminology

References herein to "an embodiment", "one embodiment", and the like, are intended to mean that the particular feature, structure, or characteristic being described is included in at least one embodiment of the invention. However, instances of such phrases do not necessarily all refer to the same embodiment, The term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the sidewall is vertical for all practical purposes but may not be precisely at 90 degrees throughout.

While terms such as "optimal", "optimize", "minimal", "minimize", "maximal", "maximize", and the like may not have certain values associated therewith, if such terms are used herein the intent is that one of ordinary skill in the art would understand such terms to include affecting a value, parameter, metric, and the like in a beneficial direction consistent with the totality of this disclosure. For example, describing a value of something as "minimal" does not require that the value actually be equal to some theoretical minimum (e.g., zero), but should be understood in a practical sense in that a corresponding goal would be to move the value in a beneficial direction toward a theoretical minimum.

Context

Recall that enterprise storage solutions such as solid-state drives (SSDs) are commonly used in client, hyperscale and enterprise compute environments. These device structures are often configured with prying holes/openings for use in opening a device assembly, i.e., for prying open an enclosure cover from its corresponding base, such as during manufacturing and testing and/or for field use. Such prying openings can cause critical ESD (electrostatic discharge) performance degradation, whereby electrical discharge energy can flow into big openings and shock the electronic components and the system generally. ESD, sometimes referred to as "static electricity", is a momentary flow of electrical current between two differently-charged objects when brought into contact or even when brought close together. It is well-known that ESD can cause damage to and even failure of solid-state electronics components such as integrated circuits, which can suffer permanent damage when subjected to high voltages. Thus, sensitive components need to be protected during and after manufacture, during shipping and device assembly, and in the finished device.

Figure 2:
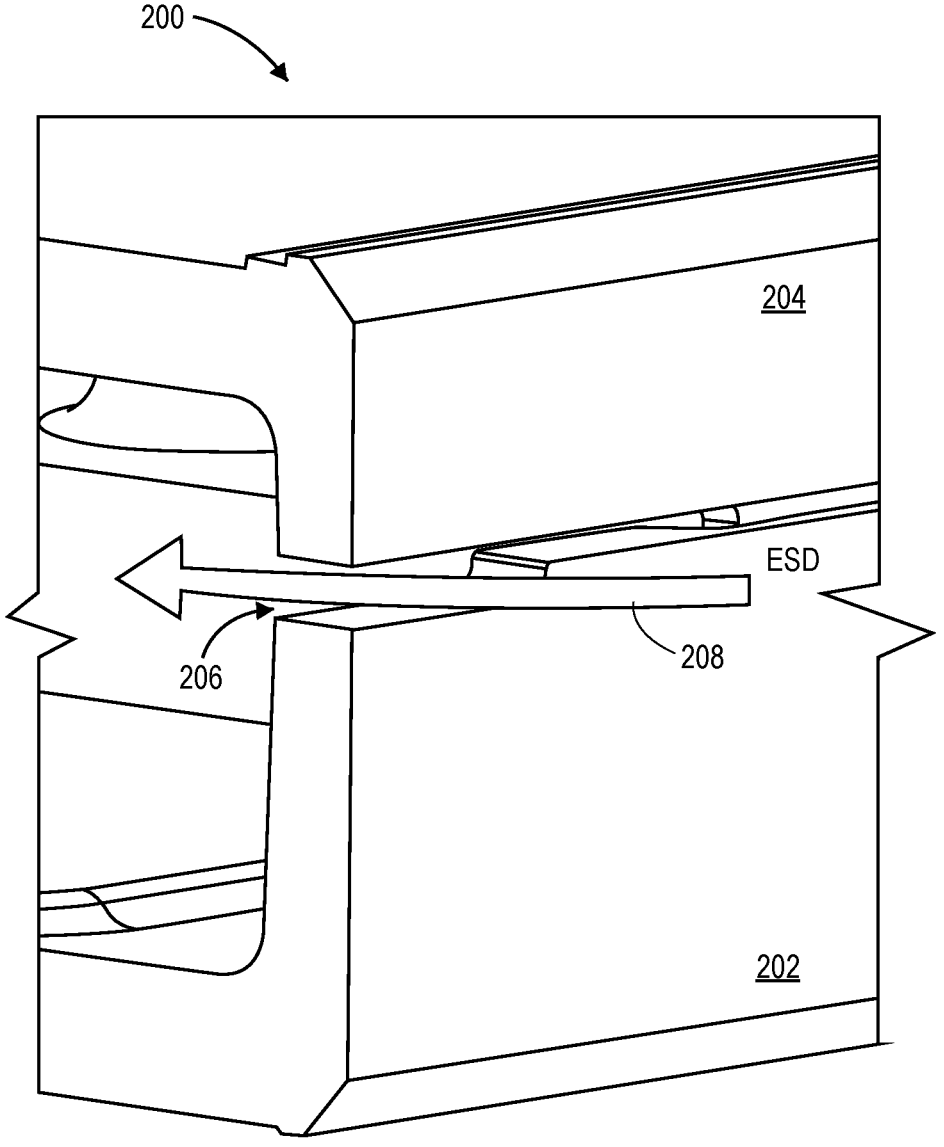
FIG. 2 is a perspective view illustrating electrostatic discharge through a typical electronic device prying opening.

FIG. 2 is a perspective view illustrating electrostatic discharge through a typical electronic device prying opening. Device 200 is depicted having an enclosure base 202 covered with an enclosure cover 204, where the interface between base 202 and cover 204 in electronic devices such as device 200 is typically designed to be tight (e.g., approaching an interference fit, although fasteners are typically used) to ensure the closing of gaps therebetween, e.g., to inhibit ESD invasion. Thus, a prying utility can be useful in opening or disassembling an electronic device such as device 200. Here, between base 202 and cover 204 is a prying gap 206, through which ESD (electrostatic discharge) 208 can readily pass. As such, ESD 208 energy is able to directly attack any printed circuit board (PCB) assembly (not shown here) housed within the enclosure of device 200, which is considered undesirable. So there remains a challenge with providing an opening that is suitable for and effective at prying open an electronic device enclosure, while at the same time protecting against ESD transfer through such an opening and onto any PCB housed therein.

ESD-Resistant Prying Structure

Figure 3A:
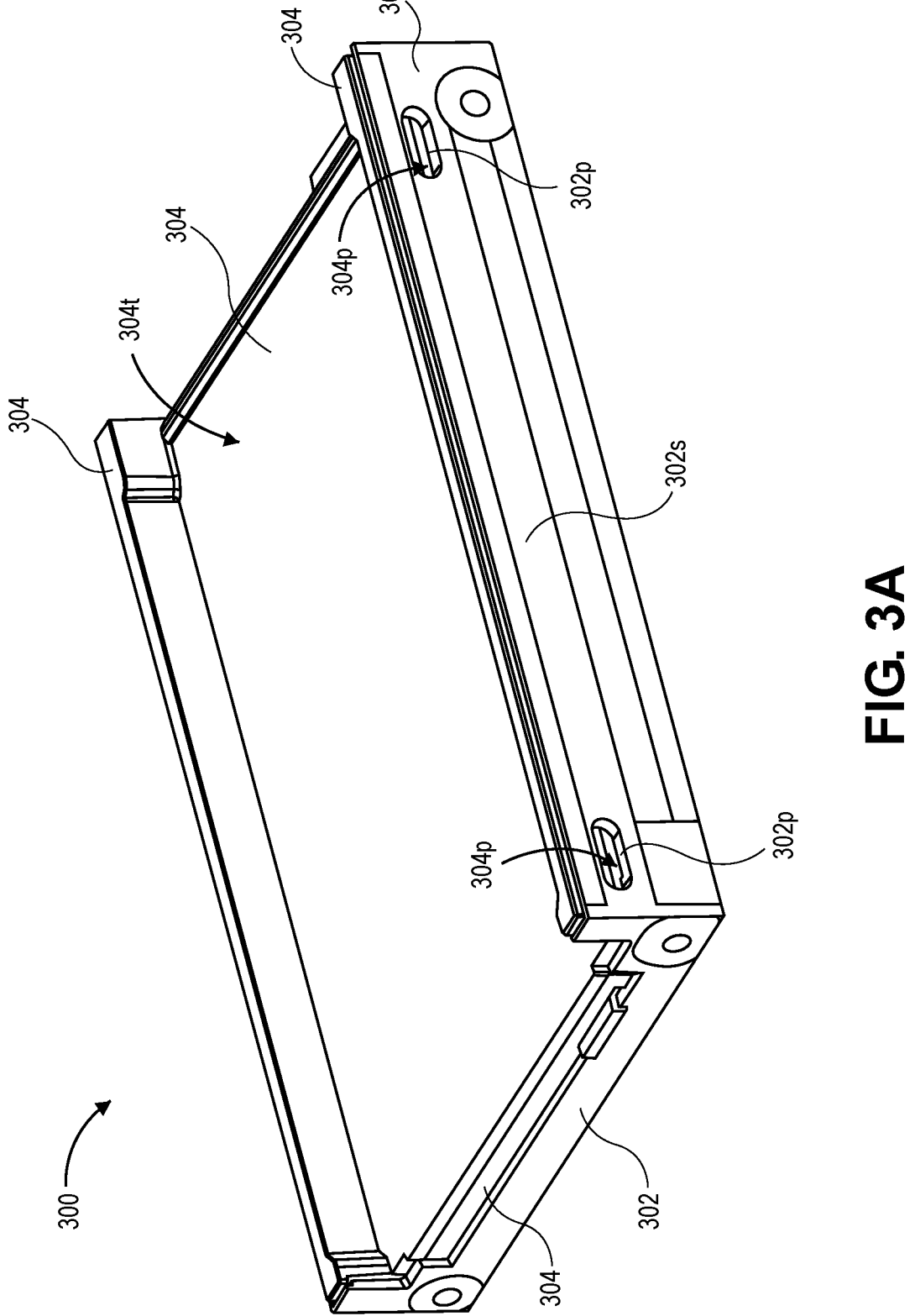
FIG. 3A is a perspective view illustrating an electronic device top/bottom assembly having a prying structure, according to an embodiment.
Figure 3B:
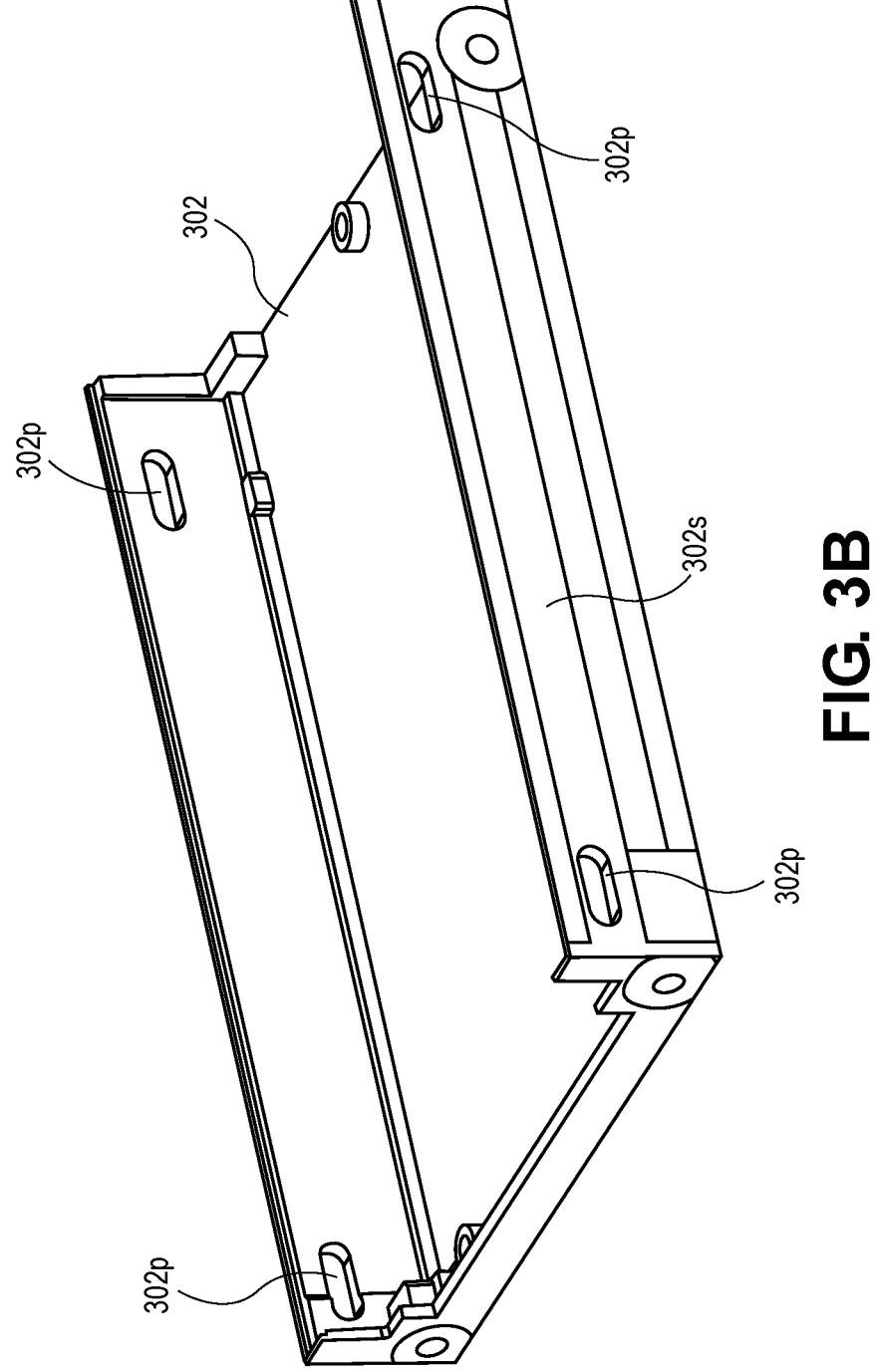
FIG. 3B is a perspective view illustrating the electronic device enclosure bottom having the prying structure of FIG. 3A, according to an embodiment.
Figure 3C:
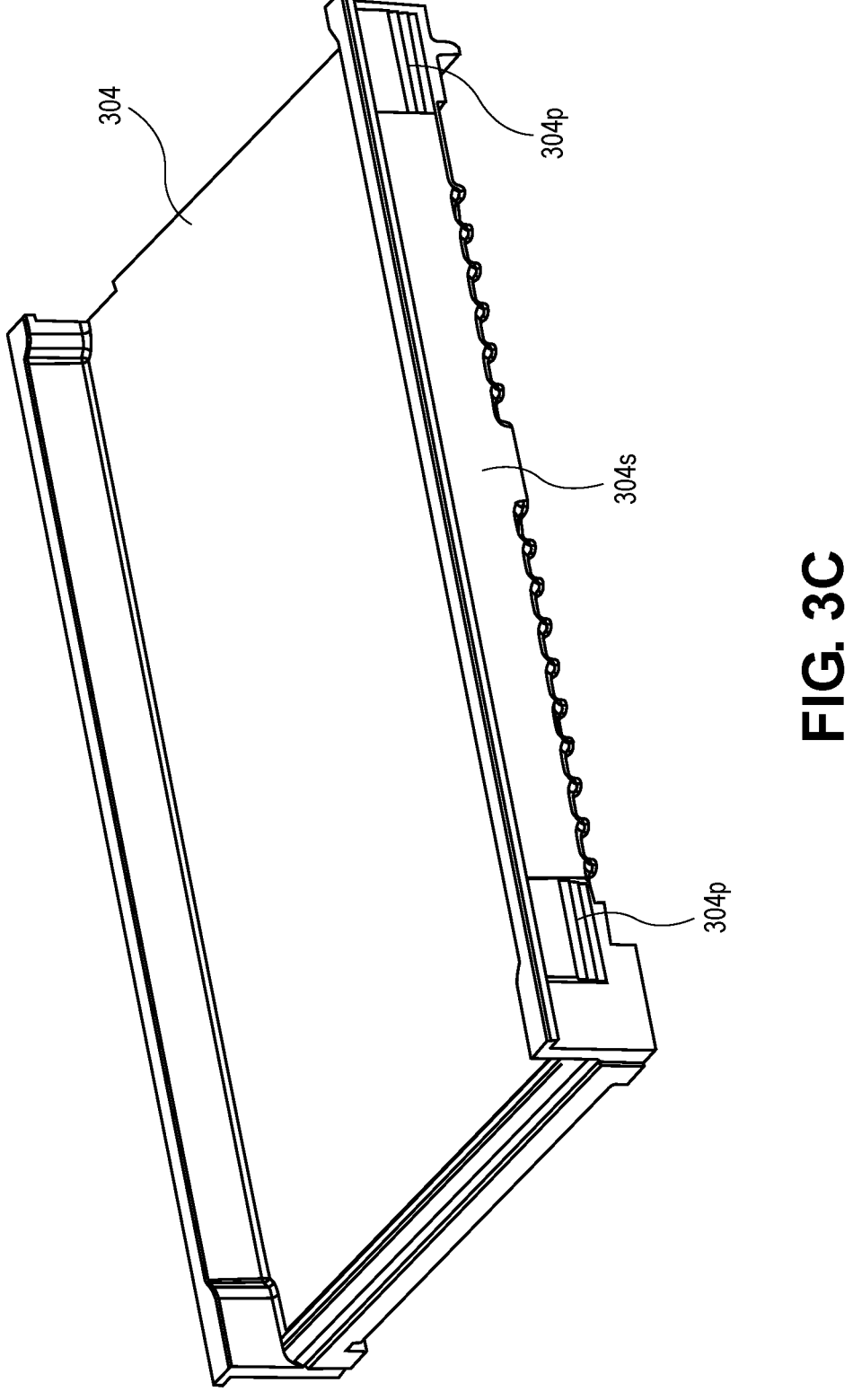
FIG. 3C is a perspective view illustrating the electronic device enclosure top having the prying structure of FIG. 3A, according to an embodiment.

FIG. 3A is a perspective view illustrating an electronic device top/bottom assembly having a prying structure, FIG. 3B is a perspective view illustrating the electronic device enclosure bottom having the prying structure of FIG. 3A, and FIG. 3C is a perspective view illustrating the electronic device enclosure top having the prying structure of FIG. 3A, all according to an embodiment. An electronic device such as illustrated electronic device 300 is configured to comprise one or more printed circuit board (PCB) (see, e.g., the components of SSD 152 of FIG. 1) within the device enclosure described hereafter. According to an embodiment, electronic device 300 comprises a PCB including non-volatile memory. Similarly, and according to an embodiment, electronic device 300 comprises a PCB including NAND (NOT AND) flash memory. Furthermore, and according to an embodiment, electronic device 300 is a solid-state drive (SSD) storage device (see, e.g., SSD 152 of FIG. 1).

According to an embodiment, electronic device 300 comprises an enclosure base 302 (or "bottom part") comprising a prying opening 302p, configured to receive a prying tool, in at least one sidewall 302s of the base 302. Depicted here are two prying openings 302p, one near each end of the sidewall 302s, according to an embodiment. Similarly, according to an embodiment there may be one or more prying openings 302p on the base 302 sidewall opposing sidewall 302s (see, e.g., FIG. 3B), or any other sidewall of the base 302. As such, the number and location of prying openings 302p constituent to a given base such as base 302 may vary from implementation to implementation based, for example, on mechanical configurations, design goals and constraints, industry standards and/or specifications, and the like. Typically, PCBs constituent to electronic device 300 are coupled with the base 302.

According to an embodiment, electronic device 300 further comprises an enclosure cover 304 (or "top part") coupled with the base 302, with the cover 304 comprising a stepped structure 304p (see, e.g., FIG. 3C), extending along a cover 304 sidewall 304s disposed within the base 302, positioned at least in part adjacent with the prying opening 302p of the base 302. As with the base 302, according to an embodiment there may be one or more stepped structures 304p on the cover 304 sidewall opposing sidewall 304s (not visible), or any other sidewall of the cover 304. As such, the number and location of stepped structures 304p constituent to a given cover such as cover 304 may also vary from implementation to implementation based, for example, on mechanical configurations, design goals and constraints, industry standards and/or specifications, and the like. However, a prying opening 302p of base 302 and a corresponding stepped structure 304p of cover 304 are designed to function conjunctionally so, according to an embodiment, there is a one-to-one relationship between the number and location of prying openings 302p and corresponding stepped structures 304p. Typically, PCBs constituent to electronic device 300 are covered by the cover 304.

Figure 4:
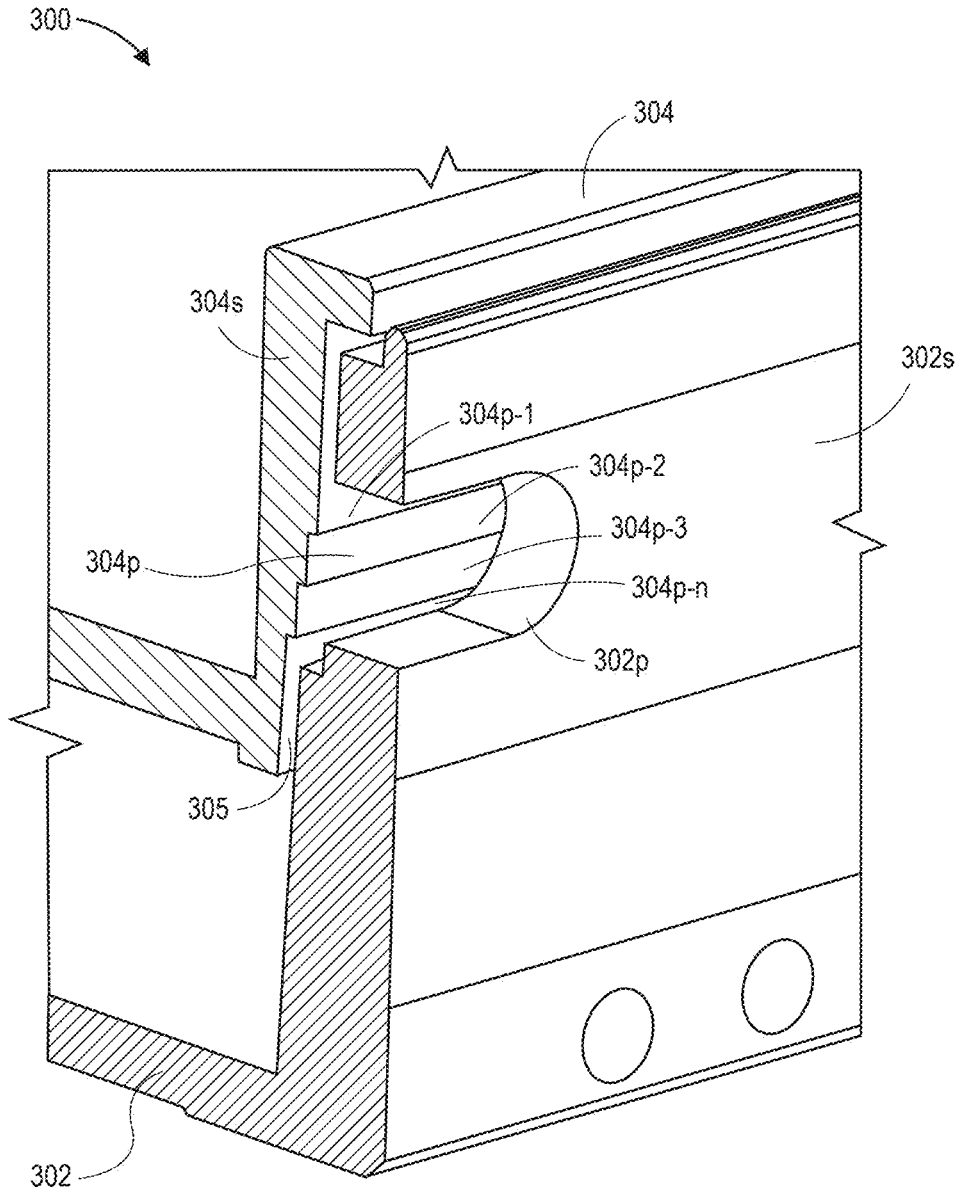
FIG. 4 is a cross-sectional perspective view illustrating the prying structure of FIG. 3A, according to an embodiment.

FIG. 4 is a cross-sectional perspective view illustrating the prying structure of FIG. 3A, according to an embodiment. Here again is depicted a magnified portion of electronic device 300 comprising the enclosure base 302 comprising a prying opening 302p through a sidewall 302s of the base 302, and a corresponding stepped structure 304p of a sidewall 304s of the cover 304. The stepped structure 304p of cover 304 is accessible to a prying tool through the prying opening 302p of base 302.

According to an embodiment and as depicted, the stepped structure 304p of the cover 304 comprises a plurality of steps, depicted here as step 304p-1, 304p-2, 304p-3 up to 304p-n, where n represents an arbitrary number of steps (here, four) that may vary from implementation to implementation. Also according to an embodiment and as depicted, the stepped structure 304p of the cover 304 comprises a plurality of steps 304p-1 through 304p-n progressively farther from the sidewall 302s of the base 302 in a direction into the base 302. Each of these embodiments facilitates the prying function, which is illustrated and described in more detail in reference to FIGS. 5A-5B.

According to an embodiment and as depicted, the cover 304 further comprises a surface 305 beyond the prying opening 302p of the base 302 in the direction into the base 302, the surface 305 forming a narrow pathway with the sidewall 302s of the base 302. See also surface 605 of FIG. 6B. Thus, the surface 305 forms the narrow pathway with the sidewall 302s of the base 302 toward the aforementioned PCB housed inside the enclosure comprising base 302 and cover 304. The narrow pathway formed between surface 305 of cover 304 and sidewall 302s of base 302 provides a structural mechanism (e.g., a relatively longer detour path) to inhibit or resist or guard against the transfer of ESD to any sensitive electronic components within the enclosure, such as the PCB, in contrast with the unguarded prying gap 206 of device 200 (FIG. 2) leading directly to any PCB housed therein.

Figure 5B:
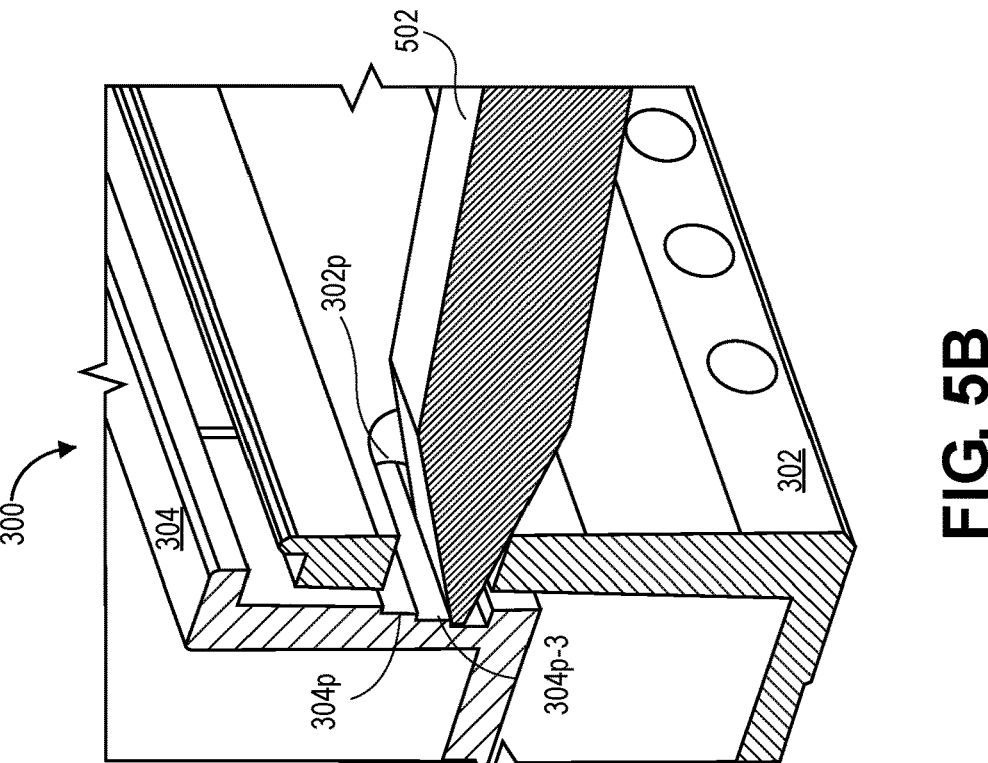
FIG. 5A and FIG. 5B are each a cross-sectional perspective view illustrating a use of the prying structure of FIG. 4, according to an embodiment.
Figure 5A:
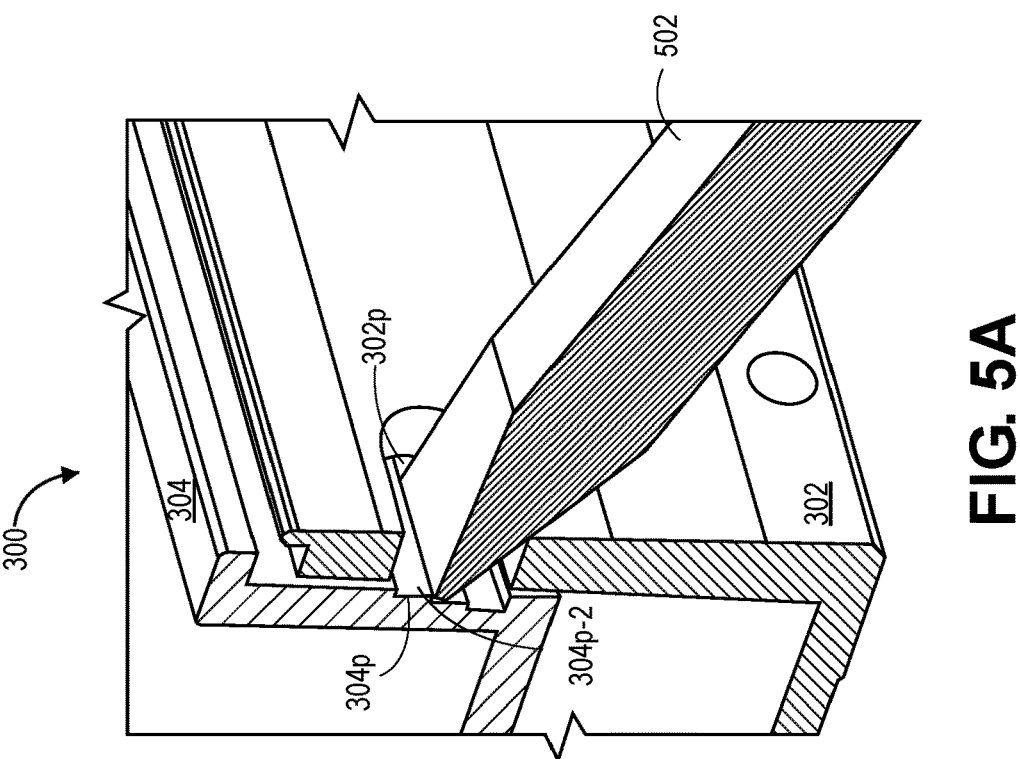

FIG. 5A and FIG. 5B are each a cross-sectional perspective view illustrating a use of the prying structure of FIG. 4, according to an embodiment. FIG. 5A depicts a prying tool 502 positioned or protruding through the prying opening 302p of base 302, thereby engaging with the stepped structure 304p of cover 304, such as by a user prying open the electronic device 300. For example and as depicted here, the prying tool 502 is engaged with step 304p-2 of stepped structure 304p. Similarly, FIG. 5B depicts prying tool 502 again or still protruding through the prying opening 302p of base 302, thereby engaging with a different portion of the stepped structure 304p of cover 304, again such as by a user prying open the electronic device 300. For example and as depicted here, the prying tool 502 is engaged with step 304*p*-3 of stepped structure 304*p*. Here, cover 304 of FIG. 5B is now more removed or lifted up or disengaged from base 302 than in FIG. 5A. Thus, one can envision how a user is enabled, with a series of prying actions with a prying tool 502, to successively engage with different steps 304*p*-1 through 304*p*-*n* (see, e.g., FIG. 4) of stepped structure 304*p* to remove cover 304 from its coupling with base 302, i.e., to pry open the electronic device 300 enclosure.

Figures 6A, 6B:
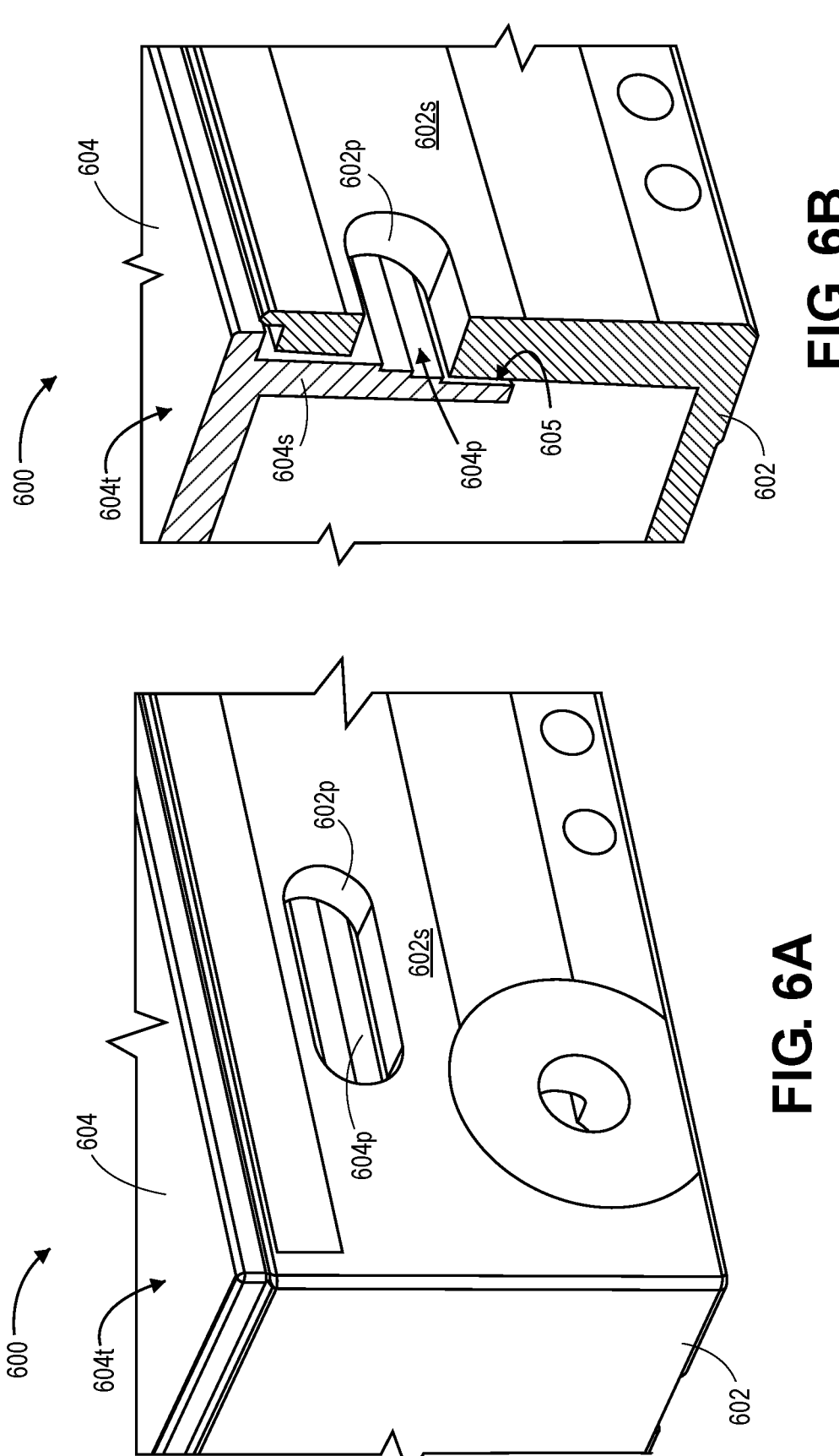
FIG. 6A is a perspective view illustrating an electronic device top/bottom assembly having a prying structure, according to an embodiment.
FIG. 6B is a cross-sectional perspective view illustrating the prying structure of FIG. 6A, according to an embodiment.

FIG. 6A is a perspective view illustrating an electronic device top/bottom assembly having a prying structure, and FIG. 6B is a cross-sectional perspective view illustrating the prying structure of FIG. 6A, both according to an embodiment. Here, a slightly different device enclosure configuration is depicted from electronic device 300 (FIGS. 3A-5B). Here also an electronic device such as electronic device 600 is configured to comprise one or more printed circuit board (PCB) (see, e.g., the components of SSD 152 of FIG. 1) within the device enclosure described hereafter. According to an embodiment, electronic device 600 comprises a PCB including non-volatile memory. Similarly, and according to an embodiment, electronic device 600 comprises a PCB including NAND flash memory. Furthermore, and according to an embodiment, electronic device 600 is a solid-state drive (SSD) storage device (see, e.g., SSD 152 of FIG. 1).

According to an embodiment, electronic device 600 comprises an enclosure base 602 (or "bottom part") comprising a prying opening 602*p*, configured to receive a prying tool, in at least one sidewall 602*s* of the base 602. Similarly, according to an embodiment there may be one or more prying openings 602*p* on the base 602 sidewall opposing sidewall 602*s*, or any other sidewall of the base 602. As such, the number and location of prying openings 602*p* constituent to a given base such as base 602 may vary from implementation to implementation based, for example, on mechanical configurations, design goals and constraints, industry standards and/or specifications, and the like. Typically, PCBs constituent to electronic device 600 are coupled with the base 602.

According to an embodiment, electronic device 600 further comprises an enclosure cover 604 (or "top part") coupled with the base 602, with the cover 604 comprising a stepped structure 604*p*, extending along a cover 604 sidewall 604*s* disposed within the base 602, positioned at least in part adjacent with the prying opening 602*p* of the base 602. By contrast with cover 304 of electronic device 300, whose main top covering portion 304*t* (FIG. 3A) is recessed within the corresponding base 304, here the main top covering portion 604*t* of cover 604 is not recessed into base 604 but is uniformly coupled with the top of each sidewall 602*s* of the base 602, to illustrate an alternative configuration for an electronic device enclosure in which one or more prying opening 302*p*, 602*p*/stepped structure 304*p*, 604*p* are implemented. As with the base 602, according to an embodiment there may be one or more stepped structures 604*p* on the cover 604 sidewall opposing sidewall 604*s* (not visible), or any other sidewall of the base 602. As such, the number and location of stepped structures 604*p* constituent to a given cover such as cover 604 may also vary from implementation to implementation based, for example, on mechanical configurations, design goals and constraints, industry standards and/or specifications, and the like. However, a prying opening 602*p* of base 602 and a corresponding stepped structure 604*p* of cover 604 are designed to function conjunctionally so, according to an embodiment, there is a one-to-one relationship between the number and location of prying openings 602*p* and corresponding stepped structures 604*p*. Typically, PCBs constituent to electronic device 600 are covered by the cover 604.

Method of Assembling a Data Storage Device

Figure 7:
FIG. 7 is a flow diagram illustrating a method of assembling a data storage device, according to an embodiment.

FIG. 7 is a flow diagram illustrating a method of assembling a data storage device, according to an embodiment. For example, the method of FIG. 7 may be implemented to assemble an electronic device as exemplified in the illustrations and descriptions corresponding to FIGS. 3A-6B.

At block 702, a printed circuit board (PCB) is coupled to an enclosure base comprising a prying opening in at least one sidewall of the base. For example, a PCB corresponding to the components of SSD 152 (e.g., interface 160 through volatile memory 172 of FIG. 1) is coupled to enclosure base 302 (FIGS. 3A-3B, 4-5B), 602 (FIGS. 6A-6B), which comprises a prying opening 302*p* (FIGS. 3A-3B, 4-5B), 602*p* (FIGS. 6A-6B) in at least one sidewall 302*s* (FIGS. 3A-3B, 4), 602*s* (FIGS. 6A-6B) of the base 302, 602.

At block 704, a cover covering the PCB is coupled to the base, the cover comprising a stepped structure extending along a cover sidewall disposed within the base and positioned at least in part adjacent with the prying opening of the base. For example, cover 304 (FIGS. 3A, 3C, 4-5B), 604 (FIGS. 6A-6B) is coupled to the corresponding base 302, 602, where the cover 304, 604 comprises a stepped structure 304*p* (FIGS. 3A, 3C, 4-5B), 604*p* (FIGS. 6A-6B) extending along a cover sidewall 304*s* (FIGS. 3A, 3C, 4), 604*s* (FIGS. 6A-6B) disposed within the base 302, 602 and positioned at least in part adjacent with the prying opening 302*p*, 602*p* of the base 302, 602.

As described throughout herein, for an electronic device such as an SSD, implementation of a prying opening in a sidewall of an enclosure base, and positioned adjacent to a corresponding stepped structure along a sidewall of an enclosure cover, enables an effective prying mechanism enabling the disassembling of the electronic device. Furthermore, a stepped structure surface extending beyond the prying opening of the base forms a narrow pathway with the sidewall of the base, thus providing a structural mechanism to inhibit the transfer of ESD to the sensitive components (e.g., of a PCB) of the device.

Physical Description of an Illustrative Operating Context

Embodiments may be used in the context of electronic devices including digital data storage devices (DSDs), such as a solid-state drives (SSDs). Thus, FIG. 1 is a block diagram illustrating a generic SSD architecture 150, for an example operating context of an electronic device with which embodiments of the invention may be implemented. The generic SSD architecture 150 depicts an SSD 152 communicatively coupled with a host 154 through a primary communication interface 156. SSD implementations are not limited to a configuration as depicted in FIG. 1, as embodiments may be implemented with SSD configurations other than that illustrated in FIG. 1 and/or with electronic devices other than SSDs.

Host 154 broadly represents any type of computing hardware, software, or firmware (or any combination of the foregoing) that makes, among others, data I/O requests or calls to one or more memory device. For example, host 154 may be an operating system executing on a computer, a tablet, a mobile phone, or generally any type of computing device that contains or interacts with storage memory. The primary interface 156 coupling host 154 to SSD 152 may be, for example, a storage system's internal bus or a communication cable or a wireless communication link, or the like.

The example SSD 152 illustrated in FIG. 1 includes an interface 160, a controller 162 (e.g., a controller having firmware logic therein), an addressing 164 function block, data buffer cache 166, and one or more non-volatile memory (NVM) components 170a, 170b-170n, where n represents an arbitrary number of NVM components that may vary from implementation to implementation.

Interface 160 is a point of interaction between components, namely SSD 152 and host 154 in this context, and is applicable at the level of both hardware and software. This enables a component to communicate with other components via an input/output (IO) system and an associated protocol. A hardware interface is typically described by the mechanical, electrical and logical signals at the interface and the protocol for sequencing them. Some non-limiting examples of common and standard interfaces include SCSI (Small Computer System Interface), SAS (Serial Attached SCSI), and SATA (Serial ATA).

An SSD 152 includes a controller 162, which incorporates the electronics that bridge the non-volatile memory components (e.g., NAND flash) to the host, such as non-volatile memory 170a, 170b-170n to host 154. The controller is typically an embedded processor that executes firmware-level code and can be a significant factor in SSD performance.

Controller 162 interfaces with non-volatile memory 170a, 170b-170n via an addressing 164 function block. The addressing 164 function operates, for example, to manage mappings between logical block addresses (LBAs) from the host 154 to a corresponding physical block address on the SSD 152, namely, on the non-volatile memory 170a, 170b-170n of SSD 152. Because the non-volatile memory page and the host sectors are different sizes, an SSD has to build and maintain a data structure that enables it to translate between the host writing data to or reading data from a sector, and the physical non-volatile memory page on which that data is actually placed. This table structure or "mapping" may be built and maintained for a session in the SSD's volatile memory 172, such as DRAM or some other local volatile memory component accessible to controller 162 and addressing 164. Alternatively, the table structure may be maintained more persistently across sessions in the SSD's non-volatile memory such as non-volatile memory 170a, 170b-170n.

Addressing 164 interacts with data buffer cache 166, in addition to non-volatile memory 170a, 170b-170n. Data buffer cache 166 of an SSD 152 typically uses DRAM as a cache, similar to the cache in hard disk drives. Data buffer cache 166 serves as a buffer or staging area for the transmission of data to and from the non-volatile memory components, as well as serves as a cache for speeding up future requests for the cached data. Data buffer cache 166 is typically implemented with volatile memory so the data stored therein is not permanently stored in the cache, i.e., the data is not persistent.

Finally, SSD 152 includes the one or more non-volatile memory 170a, 170b-170n components. For a non-limiting example, the non-volatile memory components 170a, 170b-170n may be implemented as flash memory (e.g., NAND or NOR flash), or other types of solid-state memory available now or in the future. The non-volatile memory 170a, 170b-170n components are the actual memory electronic components on which data is persistently stored. The non-volatile memory 170a, 170b-170n components of SSD 152 can be considered the analogue to the hard disks in hard-disk drive (HDD) storage devices.

Furthermore, references herein to a data storage device may encompass a multi-medium storage device (or "multi-medium device", which may at times be referred to as a "multi-tier device" or "hybrid drive"). A multi-medium storage device refers generally to a storage device having functionality of both a traditional HDD (see, e.g., HDD 100) combined with an SSD (see, e.g., SSD 150) using non-volatile memory, such as flash or other solid-state (e.g., integrated circuits) memory, which is electrically erasable and programmable. As operation, management and control of the different types of storage media typically differ, the solid-state portion of a hybrid drive may include its own corresponding controller functionality, which may be integrated into a single controller along with the HDD functionality. A multi-medium storage device may be architected and configured to operate and to utilize the solid-state portion in a number of ways, such as, for non-limiting examples, by using the solid-state memory as cache memory, for storing frequently-accessed data, for storing I/O intensive data, for storing metadata corresponding to payload data (e.g., for assisting with decoding the payload data), and the like. Further, a multi-medium storage device may be architected and configured essentially as two storage devices in a single enclosure, i.e., a traditional HDD and an SSD, with either one or multiple interfaces for host connection.

Extensions and Alternatives

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. An electronic device, comprising:
    an enclosure base comprising an enclosure base sidewall and a prying opening in the enclosure base sidewall;
    a printed circuit board (PCB) coupled with the enclosure base; and
    an enclosure cover coupled with the enclosure base and covering the PCB, the enclosure cover comprising a stepped structure having a first step and a second step extending from the first step, the stepped structure extending along an enclosure cover sidewall disposed within the base and adjacent to the prying opening of the enclosure base.

2. The electronic device of claim 1, wherein the first step of the stepped structure extends a first distance from the enclosure cover sidewall and the second step of the stepped structure extends a second distance from the enclosure cover sidewall.

3. The electronic device of claim 2, wherein the enclosure cover further comprises a surface extending beyond the prying opening of the enclosure base in a direction into the enclosure base, the surface forming a pathway with the enclosure base sidewall.

4. The electronic device of claim 1, wherein the enclosure cover further comprises a surface extending beyond the prying opening of the enclosure base, the surface forming a pathway with the enclosure base sidewall and toward the PCB.

5. The electronic device of claim 4, wherein the surface extends beyond a bottom surface of the enclosure cover.

6. The electronic device of claim 1, wherein:
the enclosure base comprises a plurality of prying openings in the enclosure base sidewall; and
the enclosure cover comprises a plurality of stepped structures, each extending along the enclosure cover sidewall and positioned adjacent to a corresponding prying opening of the plurality of prying openings of the enclosure base.

7. The electronic device of claim 1, wherein:
the enclosure base comprises a prying opening in a plurality of enclosure base sidewalls; and
the enclosure cover comprises a plurality of stepped structures, each extending along a corresponding enclosure cover sidewall of a plurality of enclosure cover sidewalls and positioned adjacent to the prying opening of a corresponding enclosure base sidewall of the plurality of enclosure base sidewalls.

8. The electronic device of claim 1, wherein the first step includes a first vertical surface and a first horizonal surface extending from the first vertical surface and the second step includes a second vertical surface extending from the first horizontal surface and a second horizontal surface extending from the second vertical surface.

9. The electronic device of claim 1, wherein a portion of the enclosure base sidewall that is proximate to the prying opening has a stairstep configuration.

10. The electronic device of claim 1, wherein at least a portion of a top surface of the enclosure cover is positioned below at least a portion of the stepped structure.

11. The electronic device of claim 1, wherein at least a portion of a top surface of the enclosure cover is flush with a top surface of the enclosure base sidewall.

12. An electronic device enclosure, comprising:
a bottom part comprising a prying opening a sidewall of the bottom part; and
a top part coupled with the bottom part and comprising:
a stepped structure extending along a top part sidewall disposed within the bottom part, at least a portion of the stepped structure positioned adjacent to the prying opening of the bottom part; and
a surface extending beyond the prying opening of the bottom part and forming a pathway with the sidewall of the bottom part.

13. The electronic device enclosure of claim 12, wherein the stepped structure of the top part comprises a plurality of steps configured to engage a prying tool.

14. The electronic device enclosure of claim 12, wherein the stepped structure of the top part comprises a plurality of steps, each step of the plurality of steps extending progressively farther from the sidewall of the top part.

15. The electronic device enclosure of claim 12, wherein:
the bottom part comprises a plurality of prying openings in the sidewall of the bottom part; and
the top part comprises a plurality of stepped structures, each extending along the top part sidewall disposed within the bottom part and positioned adjacent to a corresponding prying opening of the plurality of prying openings.

16. The electronic device enclosure of claim 12, wherein:
the bottom part comprises a prying opening in a plurality of sidewalls of the bottom part; and
the top part comprises a plurality of stepped structures, each extending along a corresponding top part sidewall of a plurality of top part sidewalls disposed within the bottom part and positioned adjacent to the prying opening of a corresponding sidewall of the plurality of sidewalls.

17. The electronic device enclosure of claim 12, wherein at least a portion of a top surface of the top part is positioned below at least the portion of the stepped structure.

18. The electronic device enclosure of claim 12, wherein the surface extends from a bottom step of the stepped structure.

19. A method of assembling an enclosure for a data storage device, comprising:
coupling a first portion of an enclosure means to a second portion of the enclosure means, the first portion of the enclosure means including:
an aperture in a sidewall of the first portion; and the second portion of the enclosure means including:
a stepped structure extending along a sidewall of the second portion and disposed within the first portion, at least a portion of the stepped structure positioned adjacent to the aperture in the sidewall of the first portion; and
a surface extending past the aperture in the sidewall of the first portion and forming a pathway with the sidewall of the first portion.

20. The method of claim 19, wherein the stepped structure comprises a first step and a second step and wherein a top surface of the first step is farther away from the sidewall of the first portion when compared to a top surface of the second step.

* * * * *